US006912302B2

(12) United States Patent
Sato et al.

(10) Patent No.: US 6,912,302 B2
(45) Date of Patent: Jun. 28, 2005

(54) MR IMAGING METHOD, 3D IMAGING METHOD AND MRI SYSTEM

(75) Inventors: Hiroshi Sato, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 707 days.

(21) Appl. No.: 09/929,729

(22) Filed: Aug. 14, 2001

(65) Prior Publication Data

US 2002/0041283 A1 Apr. 11, 2002

(30) Foreign Application Priority Data

Oct. 11, 2000 (JP) ......................................... 2000-310531

(51) Int. Cl.[7] ................................................ G06K 9/00
(52) U.S. Cl. ....................... 382/131; 382/173; 382/232; 250/363.05
(58) Field of Search ................................. 382/131, 128, 382/130, 232, 173, 288; 250/363.02, 363.04, 363.05; 378/4, 21; 600/425, 410; 324/314, 309, 307

(56) References Cited

U.S. PATENT DOCUMENTS

| 5,543,709 | A | * | 8/1996 | Kajiyama | 324/309 |
|---|---|---|---|---|---|
| 5,570,018 | A | * | 10/1996 | Halse | 324/309 |
| 5,912,557 | A | * | 6/1999 | Wilman et al. | 324/309 |
| 6,201,985 | B1 | * | 3/2001 | Polzin et al. | 600/411 |
| 6,225,804 | B1 | * | 5/2001 | Lai | 324/309 |
| 6,230,039 | B1 | * | 5/2001 | Stuber et al. | 600/410 |
| 6,351,122 | B1 | * | 2/2002 | Polzin et al. | 324/309 |
| 6,380,740 | B1 | * | 4/2002 | Laub | 324/309 |
| 6,515,477 | B1 | * | 2/2003 | Tasaka et al. | 324/309 |
| 6,630,828 | B1 | * | 10/2003 | Mistretta et al. | 324/309 |
| 2003/0011368 | A1 | * | 1/2003 | Abe | 324/309 |
| 2003/0102864 | A1 | * | 6/2003 | Welch et al. | 324/307 |

OTHER PUBLICATIONS

Alan H. Wilman, Steph J. Riederer; Performance of an ellipical centric view order for signal enhancement and motion artifact suppression in breath hold three–dimensional Gradient Echo Imagin. MRM vol. 38, pp. 793–802, 1997.

* cited by examiner

Primary Examiner—Bhavesh M. Mehta
Assistant Examiner—Barry Choobin
(74) Attorney, Agent, or Firm—Moonray Kojima

(57) ABSTRACT

With the objective of suppressing the adverse effect of residual magnetization caused by encode ordering, twelve encode points are defined as a first segment in order of decreasing distances from a center Cyz of a K space, twelve encode points are next defined as a second segment in order of decreasing distances from the center Cyz, and twelve encode points are defined as a third segment in order of decreasing distances from the center Cyz subsequently to it. Serial numbers are sequentially assigned to the encode points of the first, second, third and fourth quadrants in the first, second and third segments in order of decreasing distances from the center Cyz. Serial numbers are assigned subsequently in a manner similar to the above. Furthermore, the K space is encoded in order of the serial numbers to collect data.

22 Claims, 5 Drawing Sheets

MR IMAGING METHOD, 3D IMAGING METHOD AND MRI SYSTEM

BACKGROUND OF THE INVENTION

The present invention relates to an MR (Magnetic Resonance) imaging method, a 3D (Three-Dimension) imaging method and an MRI (Magnetic Resonance Imaging) system, and more specifically to an MR imaging method, a 3D imaging method, and an MRI system, each of which is capable of suppressing the adverse effect of residual magnetization caused by an encode order.

Figure 1:
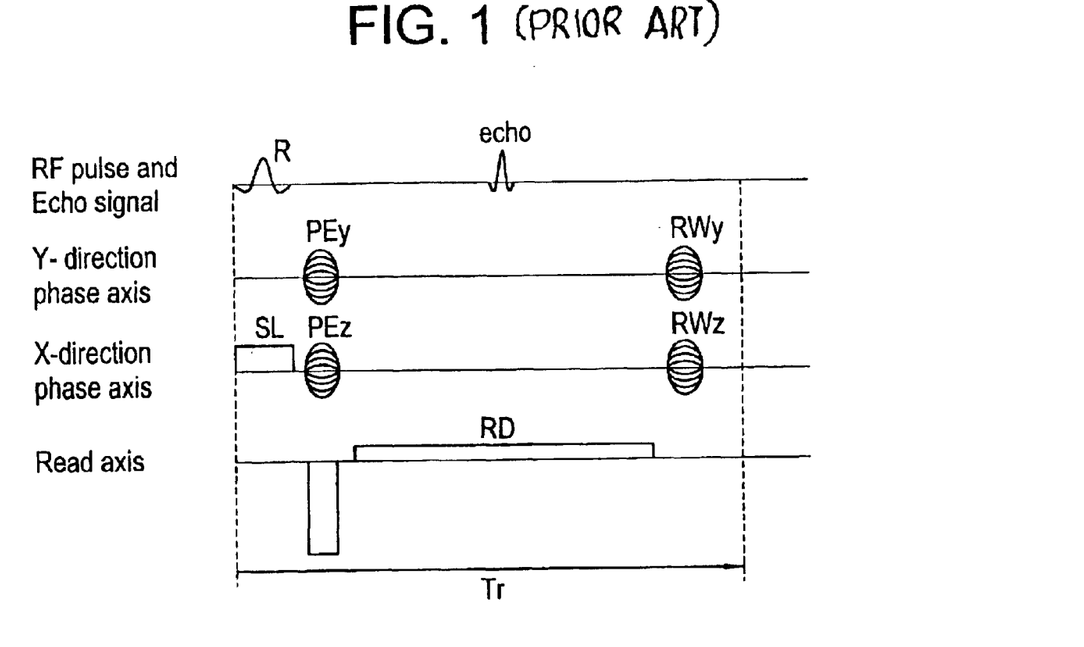
FIG. 1 is a diagram illustrating a pulse sequence for a 3D scan by way of example.

FIG. 1 is a diagram showing one example of a pulse sequence for a 3D scan, which is executed in an MRI system.

In the pulse sequence, an echo is sampled while an imaging region is being excited by an RF pulse R and a Z-direction phase axis pulse SL, encoding in a YDZ space is being performed by a Y-direction phase axis pulse PEy and a Z-direction phase axis pulse PEz, and frequency encoding is being carried out in an X direction by a read-axis pulse RD. Finally, rewinding in a YZ space is carried out by a Y-direction phase axis pulse RWy and a Z-direction phase axis pulse RWz. This is repeated while encoding in the YZ space is being changed in order so as to fill a YZ-K space. Tr indicates a repetition time.

Loci at data points on a K space, which are caused by the order in which the encoding in the YZ space is changed, are called trajectories. In general, the Elliptical Centric View Ordering has been adapted for the trajectories in the YZ space at the 3D scan. The "Elliptical Centric View Ordering" is hereinafter represented as "ECVO".

Figure 2:
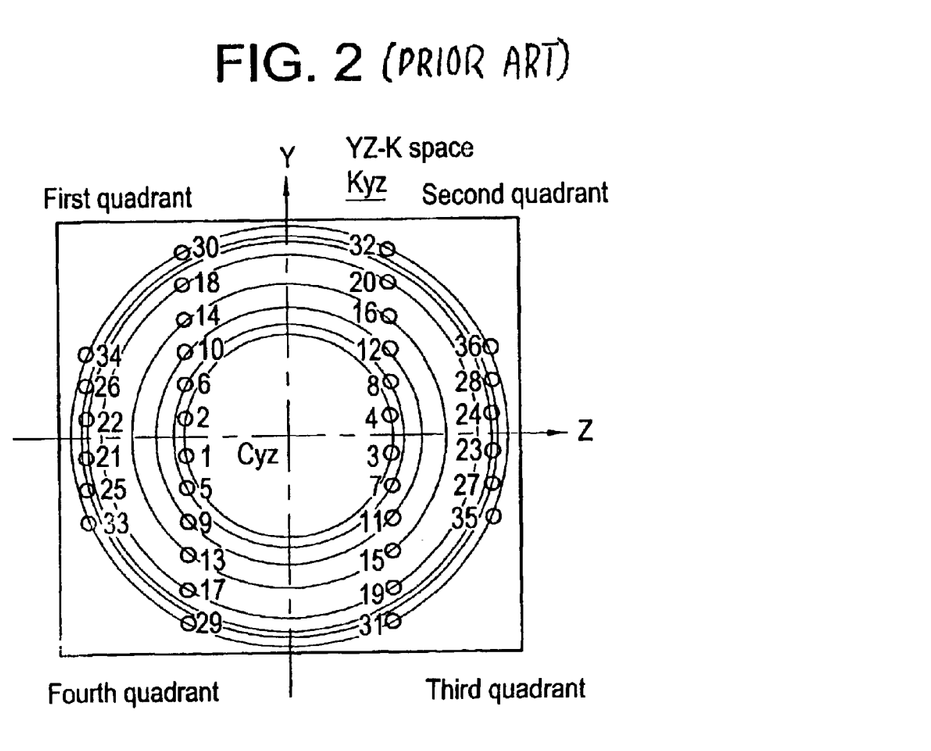
FIG. 2 is a conceptual diagram showing an ECVO-based encode order.

FIG. 2 is a conceptual diagram showing an encode order based on the ECVO.

In the ECVO, encoding is carried out in order of decreasing distances from the center Cyz of a YZ-K space. Namely, encode points to which serial numbers "1" through "36" are assigned, are encoded in order of their serial numbers in the YZ-K space shown in FIG. 2 to thereby perform a 3D scan.

Incidentally, the ECVO has been described in "Performance of an Elliptical Centric View Order for Signal Enhancement and Motion Artifact Suppression in Breathhold Three-Dimensional Gradient Echo Imaging: Alan H. Wilman, Stephen J. Riederer: MRM 38: 793–802(1997)".

In an MRI system, particularly, a permanent-magnet MRI system, the polarity of residual magnetization of a magnetic material is inverted due to the hysteresis characteristic of the magnetic material each time the polarity of a gradient magnetic field is reversed. This appears on an MR image as an artifact. Thus, the number of times that the polarity of the gradient magnetic field is inverted, may preferably be less reduced.

However, according to the encode order employed in the conventional example shown in FIG. 2, the number of times that the polarity of a gradient magnetic field on or about a Y-direction chase axis is inverted, is 35, and the number of times that the polarity of a gradient magnetic field on or about a Z-direction phase axis exists even 17. Therefore, the number of the polarity inversions increases. Accordingly, a problem arises in that the adverse effect of residual magnetization is considerable.

SUMMARY OF THE INVENTION

Therefore, an object of the present invention is to provide an MR imaging method, a 3D imaging method and an MRI system, each of which is capable of suppressing the adverse effect of residual magnetization caused by an encode order.

In a first aspect, the present invention provides an MR imaging method of encoding a K space so as to fill the same with orthogonal two directions as phase axes, comprising the steps of determining an encode order in consideration of distances from the center of the K space to individual encode points and existing quadrants, and encoding the K space in the determined encode order.

In the MR imaging method according to the first aspect, the encode order is determined in consideration of the distances from the center of the K space and the encode-point existing quadrants without determining the encode order according to only the distances from the center thereof. The reason why the quadrants are now taken into consideration is that even if different encode points in the same quadrant are encoded in succession, the polarities of gradient magnetic fields on or about the phase axes in the orthogonal two directions are not inverted. Thus, the number of times that the polarity of the gradient magnetic field is inverted, is reduced as compared with the encode order determined according to the distances alone, and hence the adverse effect of residual magnetization can be restrained.

In a second aspect, the present invention provides an MR imaging method encoding a K space so as to fill the same with orthogonal two directions as phase axes, comprising the steps of defining N1 (>4) encode points as a first segment in order of decreasing distances from the center of the K space, next defining N2 encode points as a second segment in order of decreasing distances from the center of the YZ-K space, and similarly performing segmentization subsequently; assigning serial numbers to the encode points of a first quadrant in the first segment in order of decreasing distances from the center of the K space, next assigning serial numbers to the encode points of a second quadrant therein in order of decreasing distances from the center of the K space, next assigning serial numbers to the encode points of a third quadrant therein in order of decreasing distances from the center of the K space, and next assigning serial numbers to the encode points of a fourth quadrant therein in order of decreasing distances from the center of the K space; and next assigning serial numbers to the encode points of a first quadrant in the second segment in order of decreasing distances from the center of the K space, next assigning serial numbers to the encode points of a second quadrant therein in order of decreasing distances from the center of the K space, next assigning serial numbers to the encode points of a third quadrant therein in order of decreasing distances from the center of the K space, and next assigning serial numbers to the encode points of a fourth quadrant therein in order of decreasing distances from the center of the K space, and similarly assigning serial numbers subsequently; and encoding the K space in order of the determined serial numbers to thereby collect data.

In the MR imaging method according to the second aspect, the encode points at which the distances from the center of the K space fall within predetermined ranges, are brought into segmentization. In such each segment, priority is given to the corresponding quadrant in which the encode points exist, and an encode order is determined according to the distances in the same quadrant. The reason why priority is given to the quadrant, is that even if different encode points in the same quadrant are continuously encoded, the polarities of gradient magnetic fields on or about the phase axes in the orthogonal two directions are not inverted. Thus, the number of times that the polarity of the gradient magnetic field is inverted, is reduced as compared with the encode order determined according to the distances alone, and hence the adverse effect of residual magnetization can be suppressed.

In a third aspect, the present invention provides an MR imaging method wherein in the MR imaging method constructed above, the order of the second, third, fourth and first quadrants, the order of the third, fourth, first and second quadrants, or the order of the fourth, first, second and third quadrants is used in place of the order of the first, second, third and fourth quadrants.

In the MR imaging method according to the third aspect, since a circling or turning order is taken even if encoding is started from any quadrant, the number of times that the polarity of a gradient magnetic field is inverted, can be reduced and hence the adverse effect of residual magnetization can be restrained.

In a fourth aspect, the present invention provides an MR imaging method wherein in the MR imaging method constructed above, the order of the fourth, third, second and first quadrants, the order of the third, second, first and fourth quadrants, the order of the second, first fourth and third quadrants, or the order of the first, fourth, third and second quadrants is used in place of the order of the first, second, third and fourth quadrants.

In the MR imaging method according to the fourth aspect, even if a turning direction is taken in reverse, the number of times that the polarity of a gradient magnetic filed is inverted, can be reduced and hence the adverse effect of residual magnetization can be suppressed.

In a fifth aspect, the present invention provides an MR imaging method wherein $N1 \geq 12$ in the MR imaging method constructed above.

In the MR imaging method according to the fifth aspect, since the number of encode points set for a first segment and placed in the same quadrant is three, the number of times that the polarity of a gradient magnetic field is inverted, can be reduced as compared with the conventional example (in which the number of encode points in the same quadrant is one), and hence the adverse effect of residual magnetization can be suppressed.

In a sixth aspect, the present invention provides a 3D imaging method for 3D-scanning an imaging region with an X direction as a read axis and Y and Z directions as phase axes, comprising the steps of determining an encode order in consideration of distances from the center of a YZ-K space to individual encode points and existing quadrants, and encoding the YZ-K space in the determined encode order to thereby perform a 3D scan.

In the 3D imaging method according to the sixth aspect, the encode order is determined in consideration of the distances from the center of the YZ-K space and the encode-point existing quadrants without determining the encode order according to only the distances from the center thereof. The reason why the quadrants are now taken into consideration is that even if different encode points in the same quadrant are encoded in succession, the polarities of gradient magnetic fields on or about the Y-direction phase axis and Z-direction phase axis are not inverted. Thus, the number of times that the polarity of the gradient magnetic field is inverted, is reduced as compared with the encode order determined according to the distances alone, and hence the adverse effect of residual magnetization can be suppressed.

In a seventh aspect, the present invention provides a 3D imaging method for 3D-scanning an imaging region with an X direction as a read axis and Y and Z directions as phase axes, comprising the steps of defining N1 (>4) encode points as a first segment in order of decreasing distances from the center of YZ-K space, next defining N2 encode points as a second segment in order of decreasing distances from the center of the YZ-K space and similarly performing segmentization subsequently; assigning serial numbers to the encode points of a first quadrant in the first segment in order of decreasing distances from the center of the YZ-K space, next assigning serial numbers to the encode points of a second quadrant therein in order of decreasing distances from the center of the YZ-K space, next assigning serial numbers to the encode points of a third quadrant therein in order of decreasing distances from the center of the YZ-K space, next assigning serial numbers to the encode points of a fourth quadrant therein in order of decreasing distances from the center of the YZ-K space; and next assigning serial numbers to the encode points of a first quadrant in the second segment in order of decreasing distances from the center of the YZ-K space, next assigning serial numbers to the encode points of a second quadrant therein in order of decreasing distances from the center of the YZ-K space, next assigning serial numbers to the encode points of a third quadrant therein in order of decreasing distances from the center of the YZ-X space, and next assigning serial numbers to the encode points of a fourth quadrant therein in order of decreasing distances from the center of the YZ-X space, and similarly assigning serial numbers subsequently, and encoding the YZ-K space in order of the assigned serial numbers to thereby perform a 3D scan.

In the 3D imaging method according to the seventh aspect, the encode points at which the distances from the center of the YZ-K space fall within predetermined ranges, are brought into segmentization. In such each segment, priority is given to the corresponding quadrant in which the encode points exist, and an encode order is determined according to the distances in the same quadrant. The reason why priority is given to the quadrant is that even if different encode points in the same quadrant are continuously encoded, the polarities of gradient magnetic fields on or about the Y-direction phase axis and Z-direction phase axis are not inverted. Thus, the number of times that the polarity of the gradient magnetic field is inverted, is reduced as compared with the encode order determined according to the distances alone, and hence the adverse effect of residual magnetization can be suppressed.

In an eighth aspect, the present invention provides a 3D imaging method wherein in the imaging method constructed above, the order of the second, third, fourth and first quadrants, the order of the third, fourth, first and second quadrants, or the order of the fourth, first, second and third quadrants is used in place of the order of the first, second, third and fourth quadrants.

In the 3D imaging method according to the eighth aspect, since a circling or turning order is taken even if encoding is started from any quadrant, the number of times that the polarity of a gradient magnetic field is inverted, can be reduced and hence the adverse effect of residual magnetization can be restrained.

In a ninth aspect, one present invention provides a 3D imaging method wherein in the 3D imaging method constructed above, the order of the fourth, third, second and first quadrants, the order of the third, second, first and fourth quadrants, the order of the second, first, fourth and third quadrants, or the order of the first, fourth, third and second quadrants is used in place of the order of the first, second, third and fourth quadrants.

In the 3D imaging method according to the ninth aspect, even if a turning direction is taken in reverse, the number of times that the polarity of a gradient magnetic filed is inverted, can be reduced and hence the adverse effect of residual magnetization can be suppressed.

In a tenth aspect, the present invention provides a 3D imaging method wherein N1≧12 in the 3D imaging method constructed above.

In the 3D imaging method according to the tenth aspect, since the number of encode points set for a first segment and placed in the same quadrant is three, the number of times that the polarity of a gradient magnetic field is inverted, can be reduced as compared with the conventional example (in which the number of encode points in the same quadrant is one), and hence the adverse effect of residual magnetization can be suppressed.

In an eleventh aspect, the present invention provides an MRI system for encoding a K space so as to fill the same with orthogonal two directions as phase axes to thereby collect data, comprising encode order setting means for setting an encode order in consideration of distances from the center of the K space to individual encode points and existing quadrants, and wherein the K space is encoded in the set encode order to thereby collect data.

In the MRI system according to the eleventh aspect, the MR imaging method according to the first aspect can suitably be executed.

In a twelfth aspect, the present invention provides an MRI system wherein in the MRI system constructed as described above, the encode order setting means includes segmentizing means for defining N1 (>4) encode points as a first segment in order of decreasing distances from the center of the K space, next defining N2 encode points as a second segment in order of decreasing distances from the center of the K space and similarly performing segmentization subsequently, and serial number assigning means for assigning serial numbers to the encode points of a first quadrant in the first segment in order of decreasing distances from the center of the K space, next assigning serial numbers to the encode points of a second quadrant therein in order of decreasing distances from the center of the K space, next assigning serial numbers to the encode points of a third quadrant therein in order of decreasing distances from the center of the K space, and next assigning serial numbers to the encode points of a fourth quadrant therein in order of decreasing distances from the center of the K space; and next assigning serial numbers to the encode points of a first quadrant in the second segment in order of decreasing distances from the center of the K space, next assigning serial numbers to the encode points of a second quadrant therein in order of decreasing distances from the center of the K space, next assigning serial numbers to the encode points of a third quadrant therein in order of decreasing distances from the center of the K space, and next assigning serial numbers to the encode points of a fourth quadrant therein in order of decreasing distances from the center of the K space, and similarly assigning serial numbers subsequently.

The MR imaging method according to the second aspect can suitably be executed in the MRI system according to the twelfth aspect.

In a thirteenth aspect, the present invention provides an MRI system for 3D-scanning an imaging region with an X direction as a read axis and Y and Z directions as phase axes, comprising encode order setting means for determining can encode order in consideration of distances from the center of a YZ-K space to individual encode points and existing quadrants, and wherein the YZ-K space is encoded in the set encode order to thereby perform a 3D scan.

The MR imaging method according to the sixth aspect can suitably be executed in the MRI system according to the thirteenth aspect.

In a fourteenth aspect, the present invention provides an MRI system wherein in the MRI system constructed above, the encode order setting means includes segmentizing means for defining N1 (>4) encode points as a first segment in order of decreasing distances from the center of the YZ-K space, next defining N2 encode points as a second segment in order of decreasing distances from the center of the YZ-K space and similarly performing segmentization subsequently, and serial number assigning means for assigning serial numbers to the encode points of a first quadrant in the first segment in order of decreasing distances from the center of the YZ-K space, next assigning serial numbers to the encode points of a second quadrant therein in order of decreasing distances from the center of the YZ-K space, next assigning serial numbers to the encode points of a third quadrant therein in order of decreasing distances from the center of the YZ-K space, and next assigning serial numbers to the encode points of a fourth quadrant therein in order of decreasing distances from the center of the YZ-K space; and next assigning serial numbers to the encode points of a first quadrant in the second segment in order of decreasing distances from the center of the YZ-K space, next assigning serial numbers to the encode points of a second quadrant therein in order of decreasing distances from the center of the YZ-K space, next assigning serial numbers to one encode points of a third quadrant therein in order of decreasing distances from the center of the YZ-K space, and next assigning serial numbers to the encode points of a fourth quadrant therein in order of decreasing distances from the center of the YZ-K space, and similarly assigning serial numbers subsequently.

The MR imaging method according to the seventh aspect can suitably be executed in the MRI system according to the fourteenth aspect.

In a fifteenth aspect, the present invention provides an MRI system wherein in the MR system constructed above, the serial number assigning means sets the order of the second, third and fourth and first quadrants, the order of the third, fourth, first and second quadrants, or the order of the fourth, first, second and third quadrants in place of the order of the first, second, third and fourth quadrants.

The MR imaging method according to the third aspect and the 3D imaging method according to the eighth aspect can suitably be executed in the MRI system according to the fifteenth aspect.

In a sixteenth aspect, the present invention provides an MRI system wherein in the MRI system constructed above, the serial number assigning means sets the order of the fourth, third and second and first quadrants, the order of the third, second, first and fourth quadrants, the order of the second, first, fourth and third quadrants or the order of the first, fourth, third and second quadrants in place of the order of the first, second, third and fourth quadrants.

The MR imaging method according to the fourth aspect and the 3D imaging method according to the ninth aspect can suitably be executed in the MRI system according to the sixteenth aspect.

In a seventeenth aspect, the present invention provides an MRI system wherein N1≧12 in the MRI system constructed above.

The MR imaging method according to the fifth aspect and the 3D imaging method according to the tenth aspect can suitably be executed in the MRI system according to the seventeenth aspect.

According to the MRI imaging method, 3D imaging method and MRI system of the present invention, the adverse effect of residual magnetization caused by encode ordering can be restrained.

Further objects and advantages of the present invention will be apparent from the following description of the preferred embodiments of the invention as illustrated in the accompanying drawings.

DETAILED DESCRIPTION OF THE INVENTION

The present invention will hereinafter be described in further details in accordance with illustrated embodiments.

Figure 3:
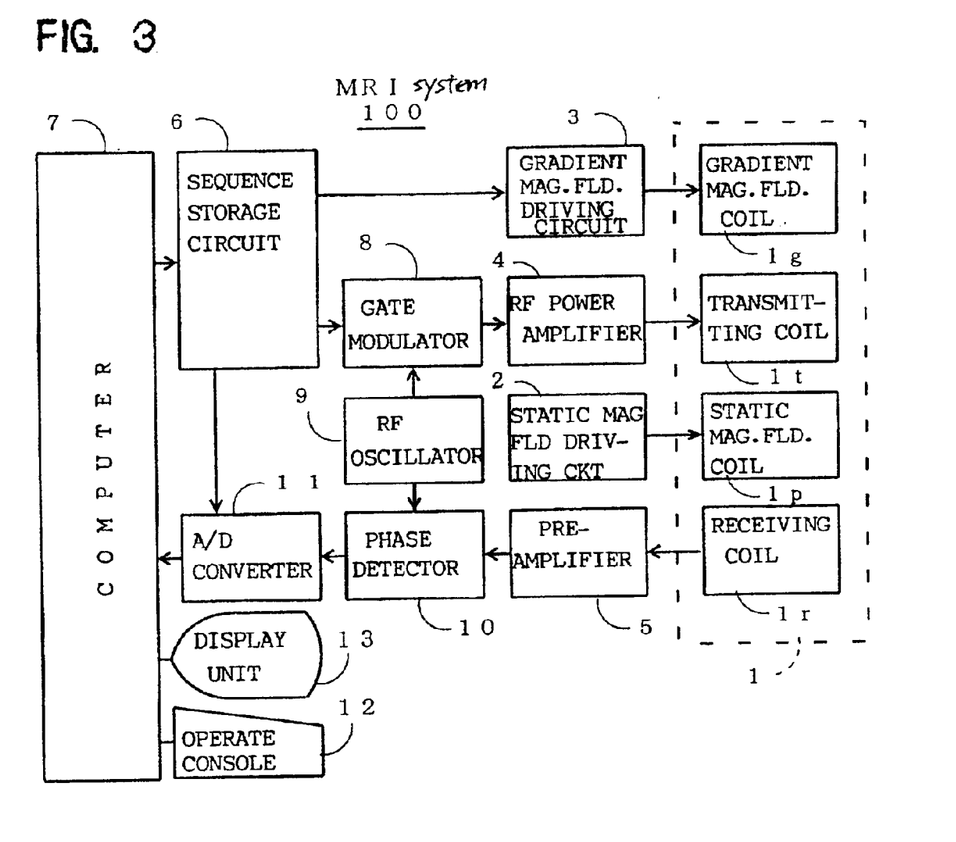
FIG. 3 is a block diagram of an MRI system according to one embodiment of the present invention.

FIG. 3 is a block diagram showing an MRI system according to one embodiment of the present invention.

In the present MRI system 100, a magnet assembly 1 has a space (bore) for inserting a sample thereinside. A static magnetic field coil 1p for applying a predetermined static magnetic field to the sample, a gradient or slope magnetic field coil 1g for generating gradient or slope magnetic fields (in which a slice gradient axis, a read gradient axis and a phase encode gradient axis are formed according to a combination of an X axis, a Y axis and a Z axis) for the X axis, Y axis and Z axis, a transmitting coil 1t for supplying an RF pulse for exciting the spin of a nucleus in the sample, and a receiving coil 1r for detecting an NMR signal from the sample are disposed in the magnet assembly 1 so as to surround the space. The static magnetic field coil 1p, gradient magnetic field coil 1g, transmitting coil 1t and receiving coil 1r are respectively connected to a static magnetic field source 2, a gradient magnetic field driving circuit or driver 3, an RF power amplifier 4 and a pre-amplifier 5.

A sequence storage circuit 6 controls or operates the gradient magnetic field driving circuit 3, based on a pulse sequence stored therein in accordance with instructions given from a computer 7 to thereby generate a gradient magnetic field from the gradient magnetic field coil 1g of the magnet assembly 1. Further, the sequence storage circuit 6 operates a gate modulator 8 to modulate a carrier output signal produced from an RF oscillator 9 to a pulsated signal represented in the form of a predetermined timing and predetermined envelope and add it to the RF power amplifier 4 as an RF pulse, where it is power-amplified. Thereafter, the RF power amplifier 4 applies the pulse to the transmitting coil 1t of the magnet assembly 1 from which a desired imaging region is selected and excited.

The pre-amplifier 5 amplifies an NMR signal from the sample, which is detected by the receiving coil 1r of the magnet assembly 1, and inputs the amplified NMR signal to a phase detector 10. The phase detector 10 receives a carrier output signal produced from the RF oscillator 9 as a reference signal, phase-detects the NMR signal supplied from the pre-amplifier 6 and supplies it to an A/D converter 11. The A/D converter 11 converts the phase-detected analog signal to digital data and inputs it to the computer 7.

When the computer 7 3D-scans an imaging region with an X direction as a read axis and Y and Z directions as phase axes, it determines an encode order in consideration of the distances between the center of a YZ-K space and individual encode points and quadrants in which the encode points exist, and thereafter executes a 3D-scan. The computer 7 reads digital data from the A/D converter 11 and performs an image reconstructing computation on the digital data to thereby generate an MR image. Further, the computer 7 takes charge of the whole control such as the reception of information inputted from an operation console 12.

A display unit 13 displays the MR image or the like thereon.

Figure 4:
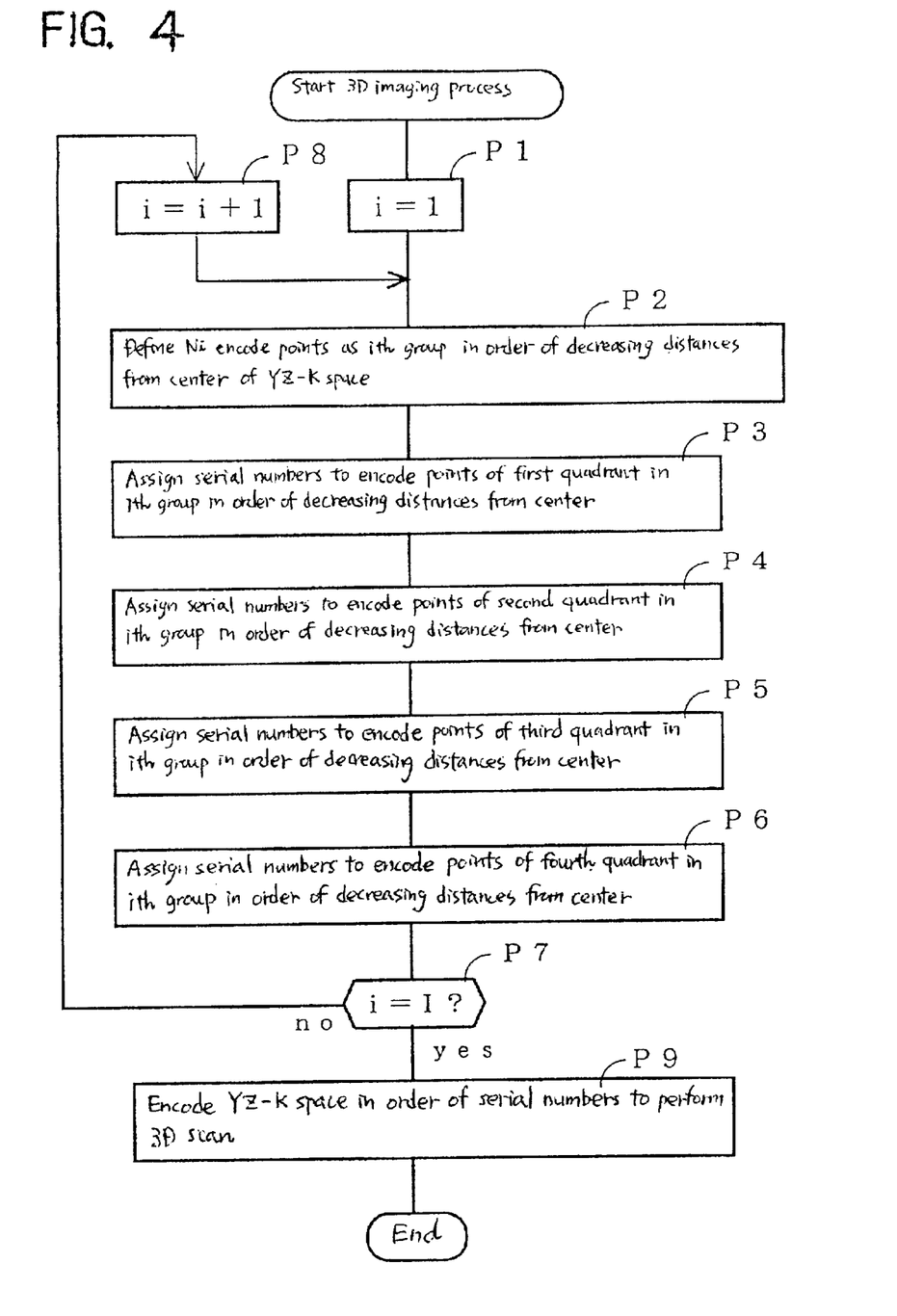
FIG. 4 is a flowchart showing a 3D imaging process employed in the one embodiment of the present invention.

FIG. 4 is a flowchart for describing a 3D imaging or shooting process executed by the MR system 100 at the time that the imaging region is 3D-scanned with the X direction as the read axis and the Y and Z directions as the phase axes.

Figure 5:
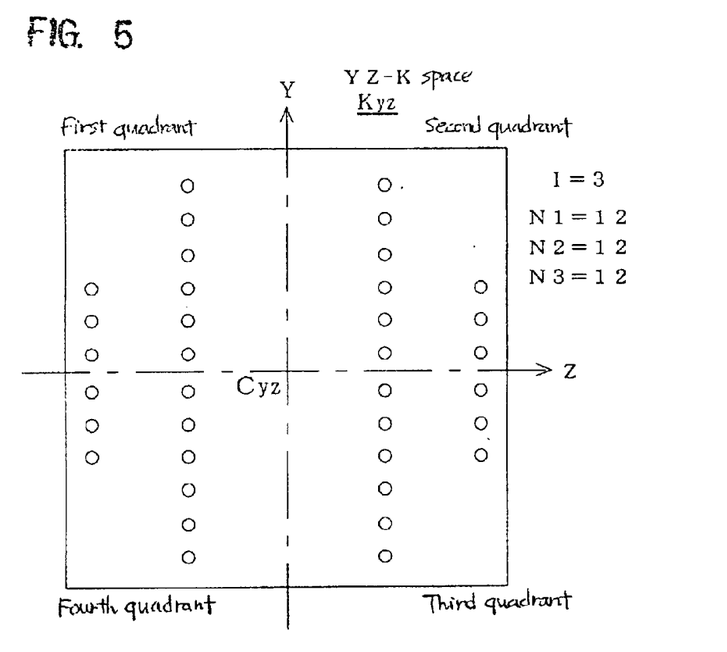
FIG. 5 is a conceptual diagram showing encode points in a YZ-K space.

Incidentally, let's assume that the positions of encode points, the number I of segments and the number Ni of encode points constituting individual segments are set in advance as shown in FIG. 5. Now consider where I=3 and Ni=12, for example.

In Step P1, a segment number counter i is initially set to "1".

Figure 6:
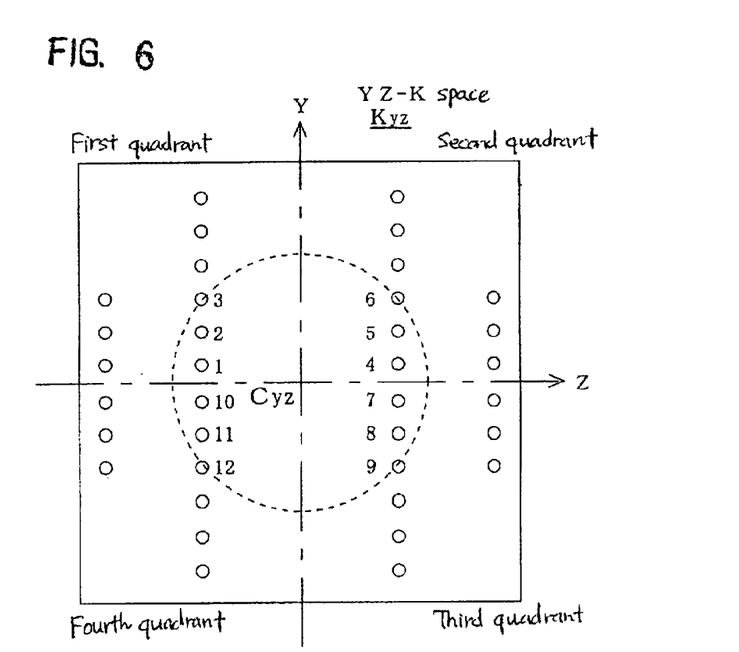
FIG. 6 is a diagram for describing encode points in a first group and their serial numbers.

In Step P2, Ni encode points are defined as a ith segment in order of decreasing distances from the center of the YZ-K space. When i=1, for example, twelve encode points to which serial numbers "1" through "12" are assigned in FIG. 6, are defined as a first segment.

In Step P3, serial numbers are assigned to encode points in the first quadrant of the ith segment in order of decreasing distances from the center of the YZ-K space. When i=1, for example, serial numbers "1" through "3" are assigned to their corresponding encode points as shown in FIG. 6.

In Step S4, serial numbers are assigned to encode points in the second quadrant of the ith segment in order of decreasing distances from the center of the YZ-K space. When i=1, for example, serial numbers "4" through "6" are assigned to their corresponding encode points as shown in FIG. 6.

In Step S5, serial numbers are assigned to encode points in the third quadrant of the ith segment in order of decreasing distances from the center of the YZ-K space. When i=1, for example, serial numbers "7" through "9" are assigned to their corresponding encode points as shown in FIG. 6.

In Step S6, serial numbers are assigned to encode points in the fourth quadrant of the ith segment in order of decreasing distances from the center of the YZ-K space. When i=1, for example, serial numbers "10" through "12" are assigned to their corresponding encode points as shown in FIG. 6.

In Step P7, a check is made as to whether i=I. If it is found not to be i=I, then the 3D imaging process proceeds to Step P8. If it is found to be i=I, then it proceeds to Step P9.

In Step P8, the segment number counter i is incremented by 1 and the 3D imaging process is returned to Step P2.

Figure 7:
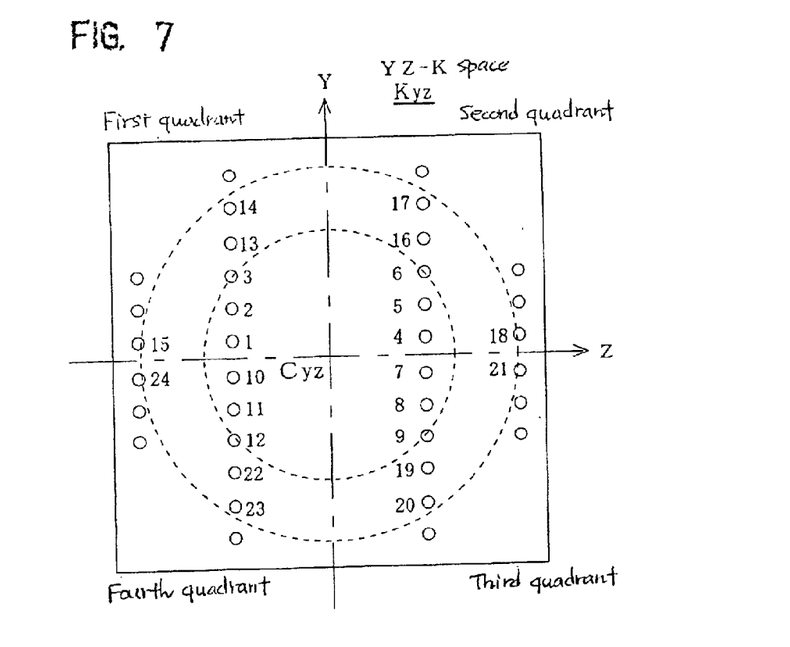
FIG. 7 is a diagram for describing encode points up to a second group and their serial numbers.
Figure 8:
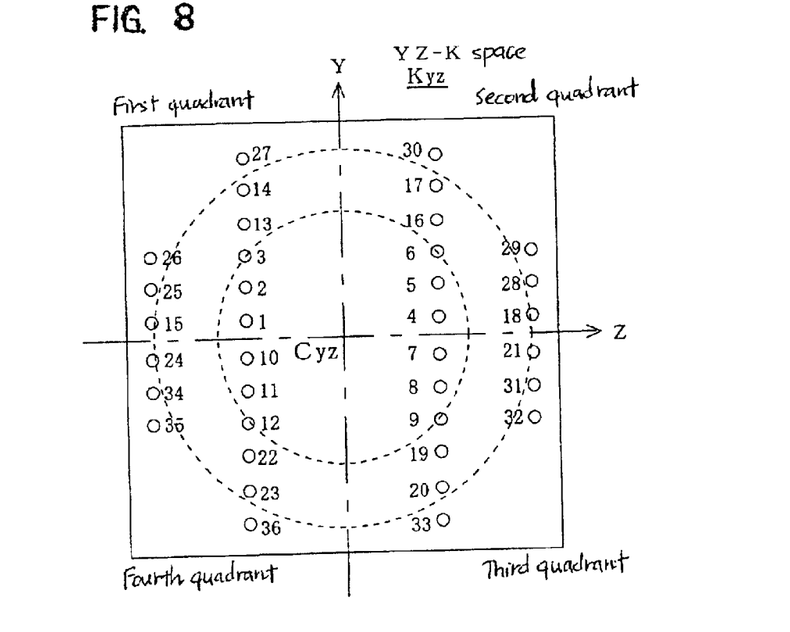
FIG. 8 is a diagram for describing encode points up to a third group and their serial numbers.

In the above-described returned Steps P2 through P6, when i=2, twelve encode points to which serial numbers "13" through "34" are assigned in FIG. 7, are defined as a second segment. The serial numbers "33" through "15" are assigned to their corresponding encode points in the first quadrant, the serial numbers "16" through "18" are assigned to their corresponding encode points in the second quadrant, the serial numbers "19" through "21" are assigned to their corresponding encode points in the third quadrant, and the serial numbers "22" through "24" are assigned to their corresponding encode points in the fourth quadrant. When i=3, twelve encode points to which serial numbers "25" through "36" are assigned in FIG. 8, are defined as a third segment. The serial numbers "25" through "27" are assigned to their corresponding encode points in the first quadrant, the serial numbers "28" through "30" are assigned to their corresponding encode points in the second quadrant, the serial numbers "31" through "33" are assigned to their corresponding encode points in the third quadrant, and the serial numbers "34" through "36" are assigned to their corresponding encode points in the fourth quadrant.

In Step P9, the YZ-K space is encoded in order of the assigned serial numbers to carry out a 3D-scan. Thereafter, the 3D imaging process is completed.

According to the above-described MRI system 100, the encode order is determined to consideration of the distances from the center Cyz of the YZ-K space and the encode-point existing quadrants without determining the encode order according to only the distances from the center Cyz of the YZ-K space. Therefore, the number of times that the polarity of a gradient magnetic field is inverted, is reduced as compared with the encode order determined according to the distances alone. It is hence possible to restrain or suppress the adverse effect of residual magnetization.

In place of the order of the first, second, third and fourth quadrants in Steps P3 through P6, the serial numbers may be assigned in order of the second, third, fourth and first quadrants, the third, fourth, first and second quadrants, or the fourth, first, second and third quadrants. Alternatively, the serial numbers may be assigned in order of the fourth, third, second and first quadrants, the third, second, first and fourth quadrants, the second, first, fourth and third quadrants, or the first, fourth, third and second quadrants.

Many widely different embodiments of the invention may be configured without departing from the spirit and the scope of the present invention. It should be understood that the present invention is not limited to the specific embodiments described in the specification, except as defined in the appended claims.

What is claimed is:

1. An imaging method of encoding a K space so as to fill said K space with orthogonal two directions as phase axes, said method comprising the steps of:

determining an encode order in consideration of distances from center of said K space to individual encode points and existing quadrants; and encoding said K space in said determined encode order; wherein said determining step comprises:

defining N1 (>4) encode points as a first segment in order of decreasing distances from center of said K space, next defining N2 encode points as a second segment in order of decreasing distances from center of said K space, and similarly performing segmentization subsequently;

assigning serial numbers to said encode points of a first quandrant in said first segment in order of decreasing distances from center of said K space, next assigning serial numbers to said encode points of a second quadrant therein in order of decreasing distances from center of said K space, next assigning serial numbers to said encode points of a third quadrant therein in order of decreasing distances from center of said K space, and next assigning serial numbers to said encode points of a fourth quadrant therein in order of decreasing distnaces from center of said K space; and next assigning serial numbers to said encode points of a first quadrant in said second segment in order of decreasing distances from center of said K space, next assigning serial numbers to said encode points of a second quadrant therein in order of decreasing distances from center of said K space, next assigning serial numbers to said encode points of a third quadrant therein in order of decreasing distances from center of said K space, and next assigning serial numbers to said encode points of fourth quadrant therein in order of decreasing distances from center of said K space, and similarly assigning serial numbers subsequently; and wherein said encoding of said K space is done in order of said determined serial number to thereby collect data.

2. The method of claim 1, wherein order of said second, third, fourth and first quadrants, order of said third, fourth, first and second quadrants, or order of said fourth, first, second and third quadrants is used in place of said order of said first, second, third and fourth quadrants.

3. The method of claim 1, wherein order of said fourth, third, second and first quadrants, order of said third, second, first and fourth quadrants, order of said second, first, fourth, third quadrants, or order of said first, fourth, third and second quadrants is used in place of said order of said first, second, third, and fourth quadrants.

4. The method of claim 1, wherein $N1 \geq 12$.

5. The method of claim 2, wherein $N1 \geq 12$.

6. The method of claim 3, wherein $N1 \geq 12$.

7. The method of claim 1, wherein an imaging region is scanned with a X direction as a read axis and Y and Z directions as phase axes; and wherein said K space is of a YZ-K space, and said center is of a YZ-K space; and wherein said encoding is in said YZ-K space thereby to perform 3D scan.

8. An imaging system for encoding a K space so as to fill said K-space with orthogonal two directions as phase axes to thereby collect data, said system comprising:

means for setting an encode order in consideration of distances from center of said K space to individual encode points and existing quadrants; and means for encoding said K space in said set encode order to thereby collect data; wherein said means for setting comprises:

means for defining N1 (>4) encode points as a first segment in order of decreasing distances from center of said K space, next defining N2 encode points as a second segment in order of decreasing distances from center of said K space and similarly performing segmentization subsequently; and means for assigning serial number to said encode points of a first quadrant in said first segment in order of decreasing distances from center of said K space, next assigning serial numbers to said encode points of a second quadrant therein in order of decreasing distances from center of said K space, next assigning serial numbers to said encode points of a third quadrant therein in order of decreasing distances from center of said K space, and next assigning serial numbers to said encode points of a fourth quadrant therein in order of decreasing distances from center of said K space; and next assigning serial numbers to said encode points of a first quadrant in said second segment in order of decreasing distances from center of said K space, next assigning serial numbers to said encode points of a second quadrant therein in order of decreasing distances from center of said K space, next assigning serial numbers to said encode points of a third quadrant therein in order of decreasing distances from center of said K space, and next assigning serial numbers to said encode points of a fourth quadrant therein in order of decreasing distances from center of said K space, and similarly assigning serial numbers subsequently.

9. The system of claim 8, wherein said space is a YZ-K space, and said center is center of said YZ-K space.

10. The system of claim 8, wherein said means for assigning serial numbers sets order of said second, third, fourth and first quadrants, order of said third, fourth, first and second quadrants or order of said fourth, first, second and third quadrants in place of said order of said first, second, third and fourth quadrants.

11. The system of claim 9, wherein said means for assigning serial numbers sets order of said second, third, fourth and first quadrants, order of said third, fourth, first and second quadrants, or order of said fourth, first, second and third quadrants in place of said order of said first, second, third and fourth quadrants.

12. The system of claim 8, wherein said means for assigning serial numbers sets order of said fourth, third, second and first quadrants, order of said third, second, first and fourth quadrants, order of said second, first, fourth and third quadrants, or order of said first, fourth, third and second quadrants, in place of said order of said first, second, third, and fourth quadrants.

13. The system of claim 9, wherein said means for assigning serial numbers sets order of said fourth, third, second and first quadrants, order of said third, second, first and fourth quadrants, order of said second, first, fourth and third quadrants, or order of said first, fourth, third, and second quadrants, in place of said order of said first, second, third, and fourth quadrants.

14. The system of claim 8, wherein $N1 \geq 12$.

15. The system of claim 9, wherein $N1 \geq 12$.

16. The system of claim 10, wherein $N1 \geq 12$.

17. An imaging method of encoding a K space so as to fill said K space with orthogonal two directions as phase axes, said method comprising the steps of:

determining an encode order in consideration of distances from center of said K space to individual encode points and existing quadrants, wherein a plurality of sets of encode points are sequentially defined as sequential segments in order of decreasing distances from center of said K space, and then assigning sequentially serial numbers to encode points of first through fourth quadrants in said first and subsequent segments in order of decreasing distances from said K space center; and encoding said K space in order of the determined serial number, thereby to collect data.

18. The method of claim 17, wherein an imaging region is scanned with an X direction as a read axis, and Y and Z directions as phase axes; and wherein said K space is of a YZ-K space, and said center is of a YZ-K space; and wherein said encoding is in said YZ-K space thereby to perform a 3D scan.

19. An imaging system for encoding a K space so as to fill said K space with orthogonal two directions as phase axes to thereby collect data, said system comprising:

means for setting an encode order in consideration of distances from center of said K space to individual encode points and existing quadrants; wherein a plurality of sets of encode points are sequentially defined as sequential segments in order of decreasing distances from center of said K space, and then assigning sequentially serial numbers to encode points of first through fourth quadrants in said first and subsequent segments in order of decreasing distances from said K space center; and means for encoding said K space in order of the determined serial number, thereby to collect data.

20. The system of claim 19, wherein said space is YZ-K space and said center is of said YZ-K space; and wherein said means for setting comprises means for determining an encode order in consideration of distances from said center of said YZ-K space to individual encode points and existing quadrants; and means for encoding in said YZ-K space in said set encode order to thereby perform a 3D scan.

21. The method of claim 17, wherein said number of encode points in each set is two.

22. The system of claim 19, wherein said number of encode points in each set is two.

* * * * *